United States Patent
Mathew

(10) Patent No.: US 10,771,083 B2
(45) Date of Patent: Sep. 8, 2020

(54) TOP PLATE SAMPLING ANALOG-TO-DIGITAL CONVERTER (ADC) HAVING A DYNAMIC COMPARATOR WITH A PREAMPLIFIER AND A CLAMP CIRCUIT

(71) Applicant: TEXAS INSTRUMENTS INCORPORATED, Dallas, TX (US)

(72) Inventor: Joseph Palackal Mathew, Podimattom (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/280,233

(22) Filed: Feb. 20, 2019

(65) Prior Publication Data

US 2020/0212924 A1   Jul. 2, 2020

Related U.S. Application Data

(60) Provisional application No. 62/786,028, filed on Dec. 28, 2018.

(51) Int. Cl.
| | |
|---|---|
| *H03M 1/12* | (2006.01) |
| *H03M 1/10* | (2006.01) |
| *H03M 1/36* | (2006.01) |
| *H03M 1/18* | (2006.01) |

(52) U.S. Cl.
CPC ......... *H03M 1/1295* (2013.01); *H03M 1/361* (2013.01); *H03M 1/10* (2013.01); *H03M 1/18* (2013.01)

(58) Field of Classification Search
CPC ...... H03M 1/1295; H03M 1/361; H03M 1/18; H03M 1/10
USPC ........................................ 341/120, 155, 136
See application file for complete search history.

(56) References Cited

U.S. PATENT DOCUMENTS

| | | | |
|---|---|---|---|
| 7,339,512 B2* | 3/2008 | Gulati ................ | H03M 1/168 341/122 |
| 9,231,539 B2* | 1/2016 | Lyden ................ | H03F 3/45183 |
| 9,281,831 B2* | 3/2016 | Marie ................ | H03M 1/002 |
| 9,325,336 B2* | 4/2016 | Mulder .............. | H03M 1/1014 |
| 9,866,238 B1* | 1/2018 | Thomsen ............ | H03M 3/462 |
| 10,250,277 B1* | 4/2019 | Sim .................... | H03M 3/464 |

* cited by examiner

*Primary Examiner* — Brian K Young
(74) *Attorney, Agent, or Firm* — John R. Pessetto; Charles A. Brill; Frank D. Cimino

(57) ABSTRACT

A system includes analog-to-digital converter (ADC) logic, wherein the ADC logic includes a stage with a dynamic comparator circuit. The ADC logic also includes a residue stage. The dynamic comparator circuit includes a preamplifier and a common mode clamp circuit for the preamplifier.

16 Claims, 5 Drawing Sheets

US 10,771,083 B2

TOP PLATE SAMPLING ANALOG-TO-DIGITAL CONVERTER (ADC) HAVING A DYNAMIC COMPARATOR WITH A PREAMPLIFIER AND A CLAMP CIRCUIT

CROSS-REFERENCE TO RELATED APPLICATION

This application claims priority to U.S. Provisional Application No. 62/786,028 filed Dec. 28, 2018, titled "Top Plate Sampling Analog-to-Digital Converter (ADC) Having a Dynamic Comparator with a Preamplifier and a Clamp Circuit," which is hereby incorporated herein in its entirety.

BACKGROUND

Many modern electronic systems involve analog-to-digital converters (ADCs) and/or digital-to-analog converters (DACs). One example ADC topology is referred to as top plate sampling ADC topology. In a top plate sampling ADC topology, an input signal is sampled using a capacitor having a first node coupled to a sampling switch and a second node coupled to ground which is then quantized by one or more pipeline stages. In a top plate sampling ADC topology, the stage one circuitry (e.g., a flash stage) receives a full-scale input exposing it to reliability issues. The performance (speed, power etc.) of stage one components, such as a flash stage comparator, is constrained by reliability requirements. Efforts to improve ADC design and performance are ongoing.

SUMMARY

In accordance with at least one example of the disclosure, a system includes analog-to-digital converter (ADC) logic, wherein the ADC logic comprises a stage with a dynamic comparator circuit. The ADC logic also comprises a residue stage. The dynamic comparator circuit comprises a preamplifier and a common mode clamp circuit for the preamplifier.

In accordance with at least one example of the disclosure, a device comprises a preamplifier circuit. The preamplifier circuit comprises a first pair of transistors, each transistor of the first pair of transistors having a control terminal, a first current terminal, and a second current terminal. Each respective control terminal is coupled to a control signal node, each respective first current terminal is coupled to a supply voltage node, and each respective second current terminal is coupled to a respective differential output node. The preamplifier circuit also comprises a second pair of transistors, each transistor of the second pair of transistors having a control terminal coupled to a respective differential input node, a first current terminal coupled to a respective differential output node, and a second current terminal coupled to a shared tail node. The preamplifier circuit also comprises a common mode clamp circuit.

BRIEF DESCRIPTION OF THE DRAWINGS

For a detailed description of various examples, reference will now be made to the accompanying drawings in which.

DETAILED DESCRIPTION

Disclosed herein are top plate sampling analog-to-digital converter (ADC) topologies having a dynamic comparator with a preamplifier and a common mode clamp. As used herein, a "dynamic comparator" refers to a clocked comparator. In one example, the preamplifier includes a first pair of transistors, each transistor of the first pair of transistors having a control terminal, a first current terminal, and a second current terminal. In some examples, each respective control terminal is coupled to a control signal node, each respective first current terminal is coupled to a supply voltage node, and each respective second current terminal is coupled to a respective differential output node. The preamplifier also includes a second pair of transistors, each transistor of the second pair of transistors having a control terminal coupled to a respective differential input node, a first current terminal coupled to a respective differential output node, and a second current terminal coupled to a shared tail node. The preamplifier also includes a common mode clamp circuit.

With the common mode clamp described herein, the voltage at internal nodes of the preamplifier are limited without any additional bias or clock signal. In this manner, the preamplifier is able to handle a higher common mode signal and/or differential input without reliability issues, resulting in higher speed and signal-to-noise ratio (SNR) with minimal overhead in terms of additional components or control signals. With the disclosed top plate sampling ADC topologies, reliability (average life span) of an ADC increases. In one example, the lifetime of an ADC device can be quadrupled (e.g., from 2.5 years to 10 years) by maintaining transistor parameters |VGS|<1V and |VDS|<1V. Without a preamplifier with common mode clamp as described herein, a stress of 1.2V is added with a 50% clock duty cycle, resulting in a lifetime of approximately 2 years. Also, power consumption improves to approximately (VDD−Vth)/VDD (around 40% lower for the same speed and noise). To provide a better understanding, various ADC options, dynamic comparator options, preamplifier options, and common mode clamp options are described using the figures as follows.

Figure 1:
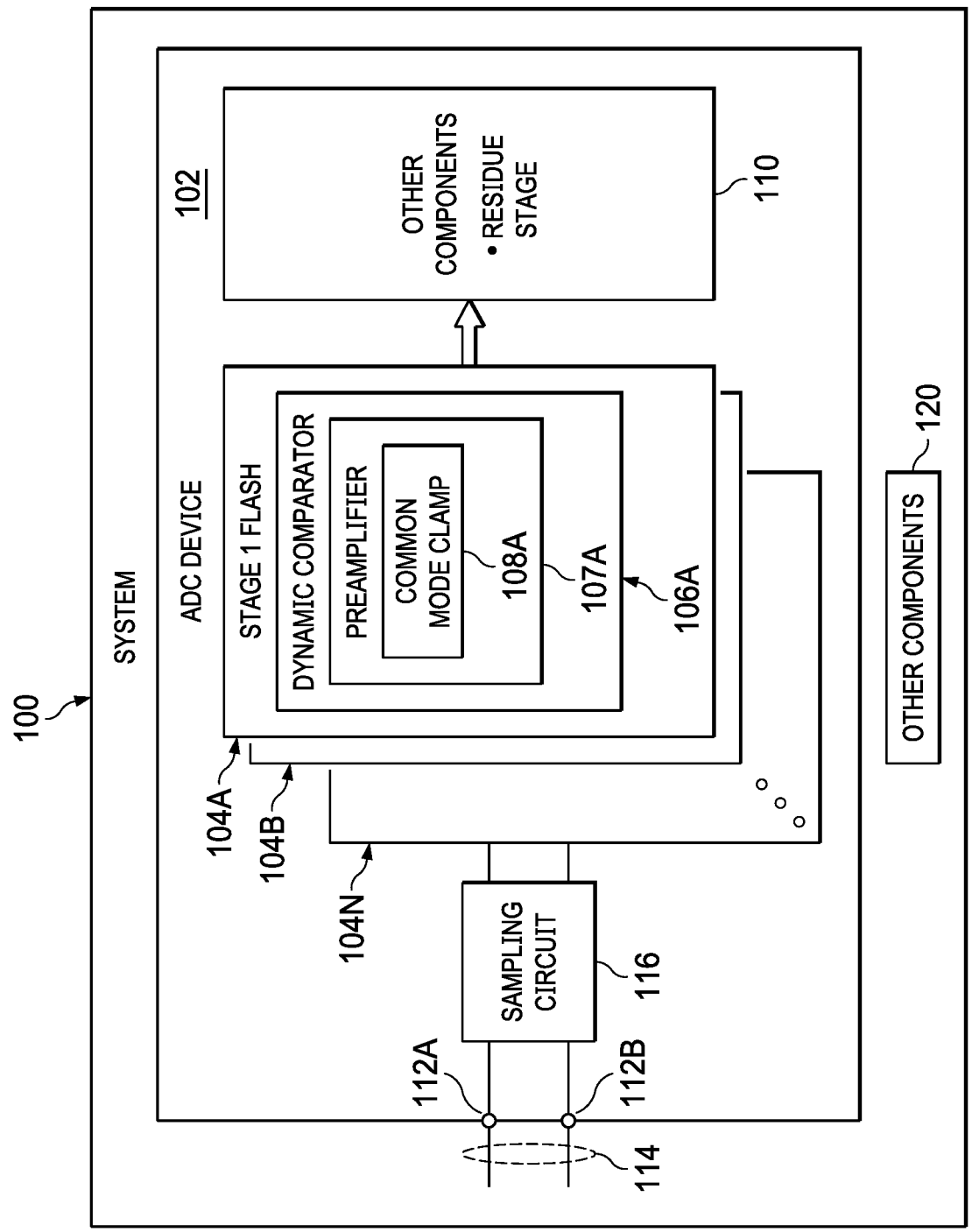
FIG. 1 is a block diagram showing a system in accordance with various examples.

FIG. 1 is a block diagram showing a system 100 in accordance with various examples. In different examples, the system 100 corresponds to an integrated circuit, a chip, a multi-die module, or a printed circuit board (PCB) with discrete components and/or or integrated circuit components. As shown, the system 100 includes an ADC device 102. In some examples, the system 100 also includes other components 120 before or after the ADC device 102. In different examples, the other components 120 include analog front-ends components, digital signal processing (DSP) components, storage components, and/or other components. In different examples, the ADC device 102 and the other components 120 includes integrated circuit components and/or discrete components.

In the example of FIG. 1, the ADC device 102 includes input signal nodes 112A and 112G configured to receive a differential input signal 114. The input signal nodes 112A and 112B are coupled to a sampling circuit 116 configured to sample the differential input signal 114 at the input signal nodes 112A and 112G. In some examples, the sampling circuit 116 includes a top plate sampling topology with a respective sampling switch and a respective capacitor for each input signal. As used herein, "top plate sampling" refers to each capacitor of a sampling circuit (e.g., the sampling circuit 116) having one of its terminals or "plates" coupled to a ground node. With this arrangement, the capacitor terminal or "plate" coupled to a ground node is referred to as a bottom plate, while the capacitor terminal or "plate" coupled to an input signal or sampling switch is referred to as a top plate.

In FIG. 1, the sampling circuit 116 couples to stage 1 flash circuits 104A-104N, where each of the stage 1 flash circuits 104A-104N includes a dynamic comparator (e.g., the stage 1 flash circuit 104A includes the dynamic comparator 106A). In different examples of the ADC device 102, the number of stage 1 flash circuits varies. As shown, the dynamic comparator 106A includes a preamplifier 107A with a common mode clamp 108A. Likewise, in some examples, each dynamic comparator of the stage 1 flash circuits 104A-104N includes a respective preamplifier with a common mode clamp.

With common mode clamp 108A, the voltage at internal nodes of the preamplifier 107A are limited without any additional bias or clock signal. In this manner, the preamplifier 107A is able to handle a higher common mode signal and/or differential input without reliability issues, resulting in higher speed and SNR with minimal overhead in terms of additional components or control signals. As desired, each of the other stage 1 flash circuits 104B-104N includes a respective preamplifier with a common mode clamp to provide similar functionality as described for the preamplifier 107A and common mode clamp 108A. As shown in FIG. 1, the output of the stage 1 flash circuits 104A-104N is provided to other components 110 (e.g., a residue stage) of the ADC device 102.

Figure 2:
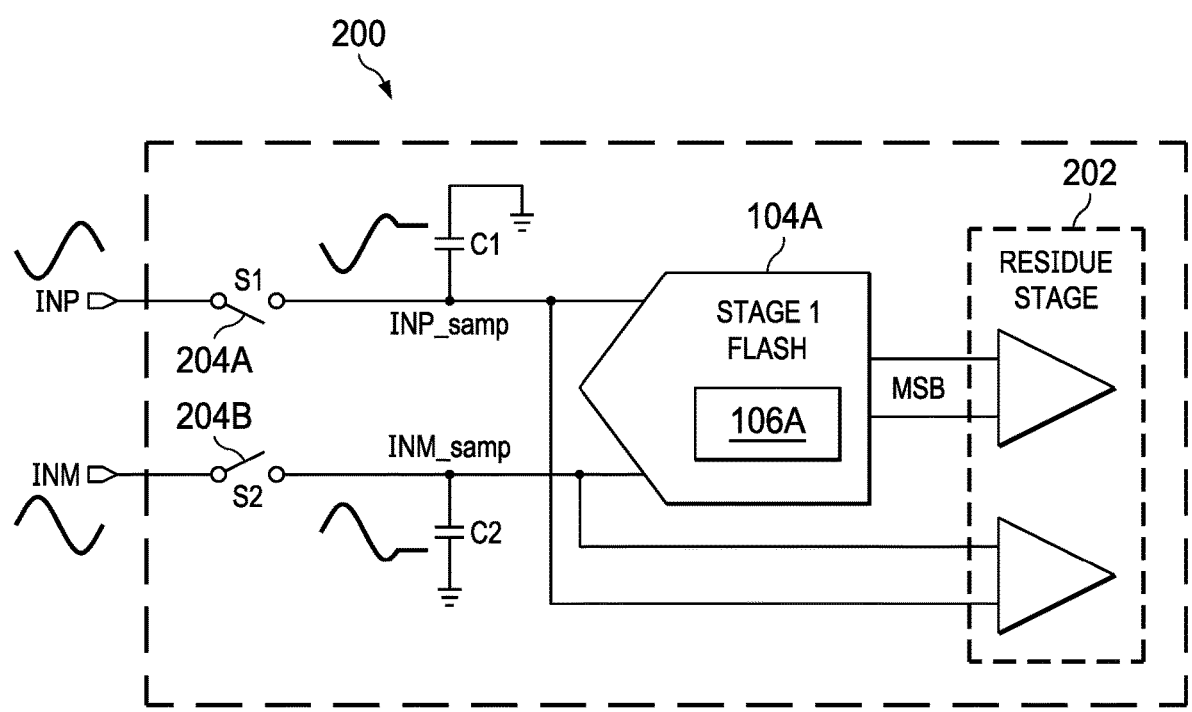
FIG. 2 is a block diagram showing a top plate sampling analog-to-digital converter (ADC) topology in accordance with various examples.

FIG. 2 is a block diagram showing a top plate sampling ADC topology 200 in accordance with various examples. In some examples, the ADC device 102 of FIG. 1 includes the top plate sampling ADC topology 200 of FIG. 2. As shown, the top plate sampling ADC topology 200 includes input signal nodes (labeled INP and INM, and an example of the input signal nodes 112A and 112B in FIG). The top plate sampling ADC topology 200 also includes a first sampling switch 204A (labeled S1) coupled between a top plate of a first capacitor, C1, and the INP node. The bottom plate of C1 is coupled to a ground node. The top plate sampling ADC topology 200 also includes a second sampling switch 204B (labeled S2) coupled between a top plate of a second capacitor, C2, and the INM node. The bottom plate of C2 is coupled to a ground node. In some examples, C1, C2, and the first and second sampling switches 204A and 204B, are components of a sampling circuit such as the sampling circuit 116 of FIG. 1.

As shown, the top plate sampling ADC topology 200 also includes the stage 1 flash circuit 104A with dynamic comparator 106A (discussed in FIG. 1) coupled to the top plates of C1 and C2, which provide sampled voltage levels (labeled INP_samp and INM_samp). The top plate sampling ADC topology 200 also includes a residue stage 202 coupled to the top plates of C1 and C2, and to an output of the stage 1 flash circuit 104A. For the top plate sampling ADC topology 200, the output of the stage 1 flash circuit 104A is the most significant bit (MSB) of a multi-digit value that represents the difference between the voltage levels at INP and INM. Other less significant bits of the multi-bit value are determined by the residue state 202.

While not explicitly shown in FIG. 2, the dynamic comparator 106A includes the preamplifier 107A and the common mode clamp 108A discussed in FIG. 1. Again, with the common mode clamp 108A, the voltage at internal nodes of the preamplifier 107A are limited without any additional bias or clock signal. In this manner, the preamplifier 107A is able to handle a higher common mode signal and/or differential input signal (received at INP and INM) without reliability issues, resulting in higher speed and SNR with minimal overhead in terms of additional components or control signals.

Figure 3A:
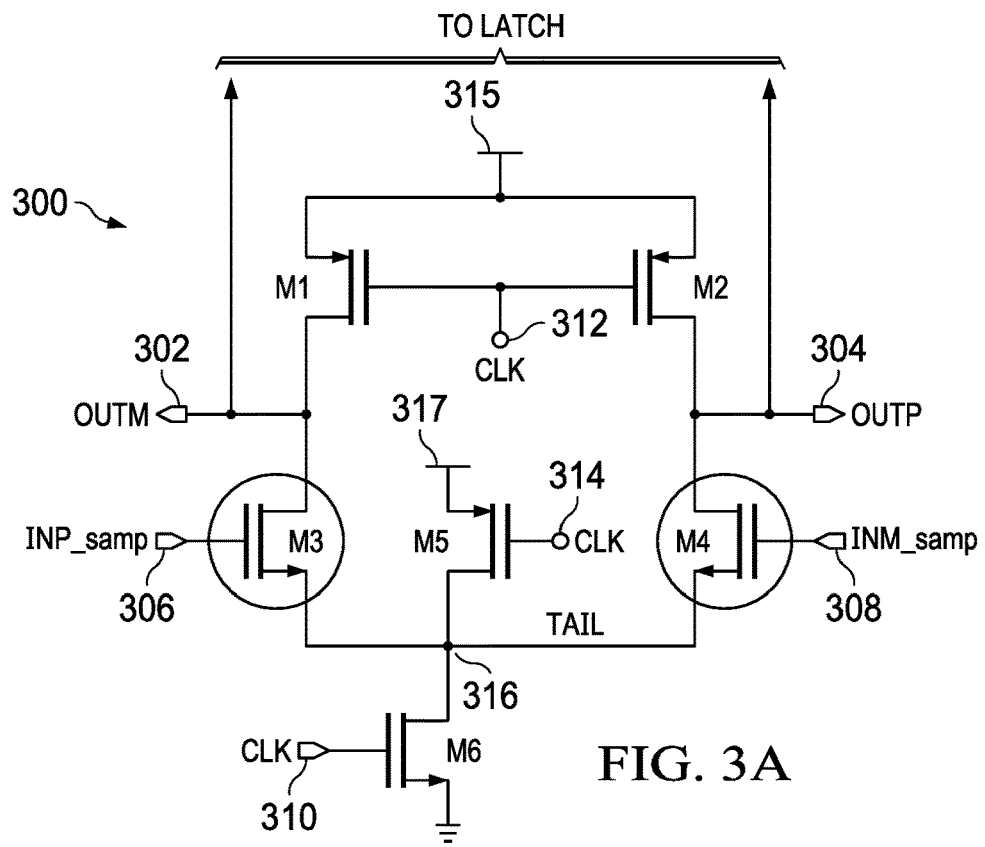
FIG. 3A is a schematic diagram of a dynamic comparator circuit without a common mode clamp.

FIG. 3A is a schematic diagram of a dynamic comparator circuit 300 without a common mode clamp. As shown, the dynamic comparator circuit 300 includes a first pair of transistors (M1 and M2), where each of M1 and M2 has a control terminal, a first current terminal, and a second current terminal. As shown, each respective control terminal of M1 and M2 is coupled to a control signal node 312 (to receive a control signal, CLK). Meanwhile, each respective first current terminal of M1 and M2 is coupled to a supply voltage node 315 (to receive a supply voltage, VDD). Also, each respective second current terminal of M1 and M2 is coupled to a respective differential output node 302 and 304. More specifically, the second current terminal of M1 is coupled to a first differential output node 302 (to provide differential output signal, OUTM), and the second current terminal of M2 is coupled to a second differential output node 304 (to provide differential output signal, OUTP). In some examples, M1 and M2 are PMOS transistors as represented in FIG. 3A. The dynamic comparator circuit 300 also includes a second pair of transistors (M3 and M4), where each of M3 and M4 has a control terminal, a first current terminal, and a second current terminal. As shown, each of M3 and M4 has its control terminal coupled to a respective differential input node 306 and 308. More specifically, the control terminal of M3 receives the INP_samp signal from a first differential input node 306. Meanwhile, the control terminal of M4 receives the INM_samp signal from a second differential input node 308. Also, the first current terminal of M3 is coupled to the first differential output node 302. Meanwhile, the first current terminal of M4 is coupled to the second differential output node 304. In the example of FIG. 3A, the second current terminals of M3 and M4 are coupled to a shared tail node 316 (labeled TAIL). In some examples, M3 and M4 are NMOS transistors as represented in FIG. 3A.

The dynamic comparator circuit 300 also includes another transistor (M5) coupled to the tail node 316. More specifically, the second current terminal of M5 is coupled to the tail node 316. Meanwhile, the control terminal of M5 is coupled to a control signal node 314 to receive CLK. Also, the first current terminal of M5 is coupled to a supply voltage node 317 (to receive VDD). In some examples, M5 is a PMOS transistor as represented in FIG. 3A. The dynamic comparator circuit 300 also includes another transistor (M6) coupled to the tail node 316. More specifically, the first current terminal of M6 is coupled to the tail node 316. Meanwhile, the control terminal of M6 is coupled to a control signal node 310 to receive CLK. Also, the second current terminal of M6 is coupled to a ground node. In some examples, M6 is a NMOS transistor as represented in FIG. 3A. For the dynamic comparator circuit 300 of FIG. 3A, the transistors M1-M6 form a preamplifier circuit. In some examples, the differential output signal nodes 302 and 304 of the dynamic comparator circuit 300 of FIG. 3A are coupled to a latch (e.g., the latch is part of a stage 1 flash circuit such as the stage 1 flash circuit 104A).

Figure 3B:
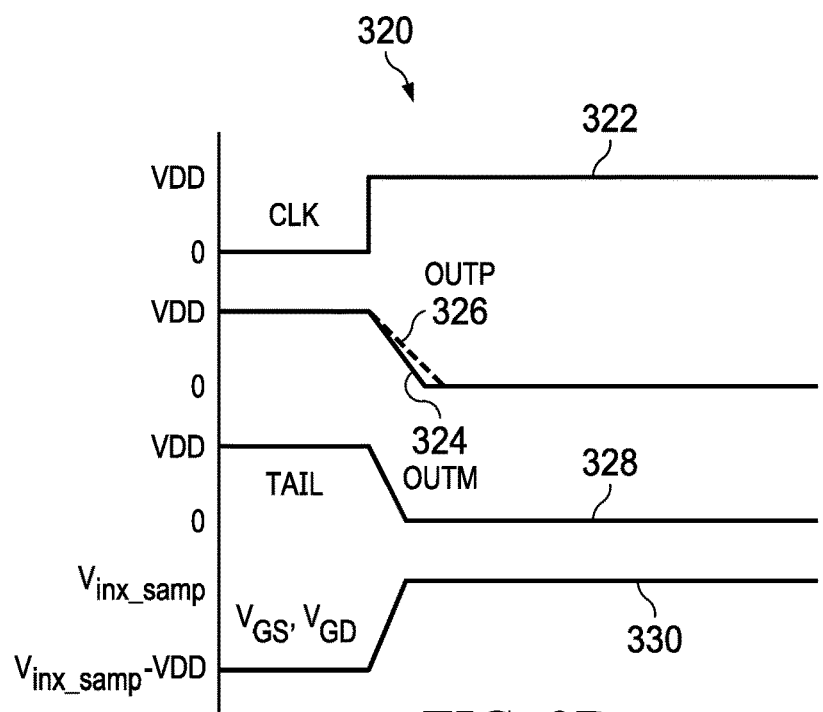
FIG. 3B is a graph showing signals related to the dynamic comparator circuit of FIG. 3A.

FIG. 3B is a graph 320 showing signals related to the dynamic comparator circuit 300 of FIG. 3A. As shown in graph 320, when the CLK signal 322 transitions from 0 to VDD, the OUTP signal 326 and the OUTM signal 324 transition from VDD to 0 with different downward slopes. Also, the signal 328 at the tail node transitions from VDD to 0. Finally, a signal 330 representing the gate-to-source voltage (Vgs) and the gate-to-drain voltage (Vgd) for M3 and M4 transitions from V_INx_samp–VDD to V_INx_samp, where V_INx_samp corresponds to the voltage level of INP_samp or INM_samp. As represented in FIG. 3B, the magnitude of the signal 330 can reach V_Inx_samp which is limited to less than VDD for reliable operation of M3 and M4, resulting in lower speeds and/or lower SNR than is desired.

Figure 4A:
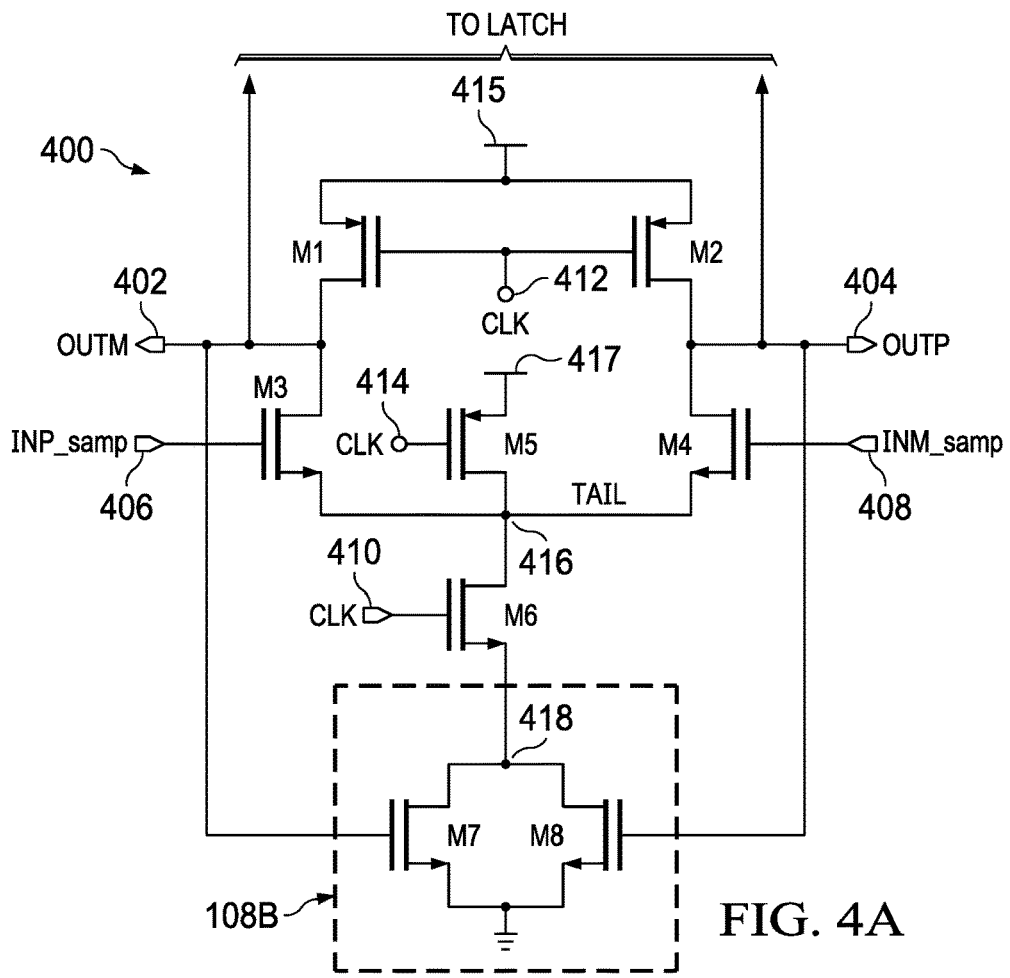
FIG. 4A is a schematic diagram of a dynamic comparator circuit with a common mode clamp.

FIG. 4A is a schematic diagram of a dynamic comparator circuit 400 with a common mode clamp. As shown, the dynamic comparator circuit 400 includes a first pair of transistors (M1 and M2), where each of M1 and M2 has a control terminal, a first current terminal, and a second current terminal. As shown, each respective control terminal of M1 and M2 is coupled to a control signal node 412 (to receive a control signal, CLK). Meanwhile, each respective first current terminal of M1 and M2 is coupled to a supply voltage node 415 (to receive a supply voltage, VDD). Also, each respective second current terminal of M1 and M2 is coupled to a respective differential output node 402 and 404. More specifically, the second current terminal of M1 is coupled to a first differential output node 402 (to provide differential output signal, OUTM), and the second current terminal of M2 is coupled to a second differential output node 404 (to provide differential output signal, OUTP). In some examples, M1 and M2 are PMOS transistors as represented in FIG. 4A. The dynamic comparator circuit 400 also includes a second pair of transistors (M3 and M4), where each of M3 and M4 has a control terminal, a first current terminal, and a second current terminal. As shown, each of M3 and M4 has its control terminal coupled to a respective differential input node 406 and 408. More specifically, the control terminal of M3 receives the INP_samp signal from a first differential input node 406. Meanwhile, the control terminal of M4 receives the INM_samp signal from a second differential input node 408. Also, the first current terminal of M3 is coupled to the first differential output node 402. Meanwhile, the first current terminal of M4 is coupled to the second differential output node 404. In the example of FIG. 4A, the second current terminals of M3 and M4 are coupled to a shared tail node 416 (labeled TAIL). In some examples, M3 and M4 are NMOS transistors as represented in FIG. 4A.

The dynamic comparator circuit 400 also includes another transistor (M5) coupled to the tail node 416. More specifically, the second current terminal of M5 is coupled to the tail node 416. Meanwhile, the control terminal of M5 is coupled to a control signal node 414 to receive CLK. Also, the first current terminal of M5 is coupled to a supply voltage node 417 (to receive VDD). In some examples, M5 is a PMOS transistor as represented in FIG. 4A. The dynamic comparator circuit 400 also includes another transistor (M6) coupled to the tail node 416. More specifically, the first current terminal of M6 is coupled to the tail node 416. Meanwhile, the control terminal of M6 is coupled to a control signal node 410 to receive CLK. Also, the second current terminal of M6 is coupled to a common mode clamp 108B circuit (an example of the common mode clamp circuit 108A in FIG. 1). In some examples, M6 is a NMOS transistor as represented in FIG. 4A. For the dynamic comparator circuit 400 of FIG. 4A, the transistors M1-M6 form a preamplifier circuit. In some examples, the differential output signal nodes 402 and 404 of the dynamic comparator circuit 400 of FIG. 3A are coupled to a latch (e.g., the latch is part of a stage 1 flash circuit such as the stage 1 flash circuit 104A).

As shown, the common mode clamp circuit 108B comprises a pair of transistors (M7 and M8), where each of M7 and M8 have a control terminal, a first current terminal, and a second current terminal, wherein each respective control terminal is coupled to a respective differential output node. More specifically, the control terminal of M7 is coupled to the differential output node 402, and the control terminal of M8 is coupled to the differential output node 404. Also, each respective first current terminal of M7 and M8 is coupled to the second current terminal of M6 (M6 is sometimes referred to as a tail transistor). Also, each respective second current terminal of M7 and M8 is coupled to a ground node.

Figure 4B:
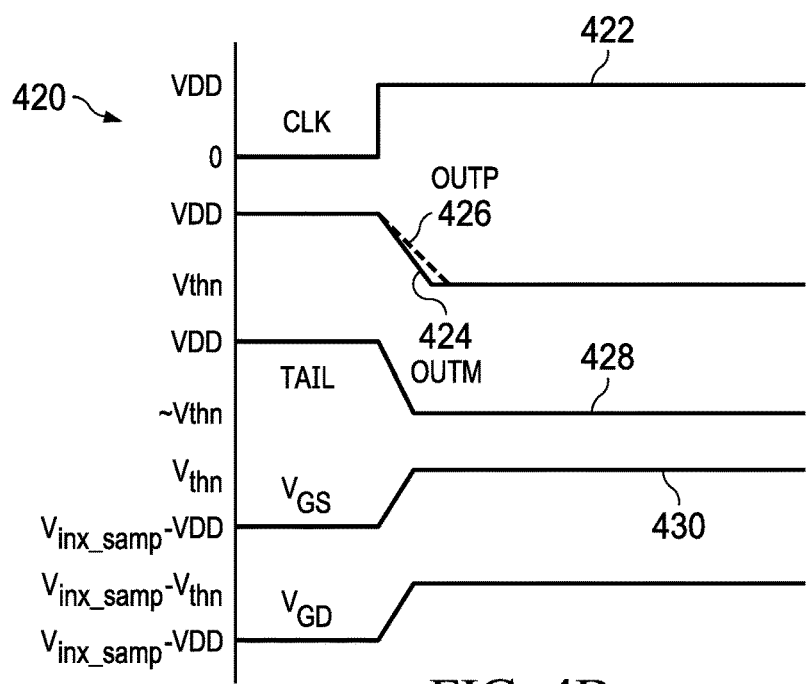
FIG. 4B is a graph showing signals related to the dynamic comparator circuit of FIG. 4A.

FIG. 4B is a graph 420 showing signals related to the dynamic comparator circuit 400 of FIG. 4A. As shown in graph 420, when the CLK signal 422 transitions from 0 to VDD, transistor M6 turns on and transistors M1, M2 turn off. This causes current to flow through M7, M8, M6, M3, and M4 discharging capacitance at the OUTP signal 426 and the OUTM signal 424. This causes OUTP signal 426 and the OUTM signal 424 to fall from VDD with different downward slopes (depending on the differential voltage V_Inp_samp–V_Inm_Samp). As the voltage of the OUTP signal 426 and the OUTM signal 424 falls, the current through M7 and M8 is reduced and eventually reach zero when the OUTP signal 426 and the OUTM signal 424 reaches Vthn. Meanwhile, the signal 428 at the tail node transitions from VDD to a voltage level (approximately V_Incm_samp–Vthn) where V_incm_samp is the common-mode voltage (V_Inp_samp–V_Inm_Samp)/2. Finally, the signal 430 in FIG. 4B represents the gate-to-source voltage (Vgs) of M3 and M4 when transitioning from V_INx_samp–VDD to Vthn. Also, the signal 432 represents the gate-to-drain voltage (Vgd) for M3 and M4 when transitioning from V_INx_samp–VDD to V_INx_samp–Vthn, where V_INx_samp corresponds to the voltage level of INP_samp or INM_samp.

As represented in FIG. 4B the magnitude of signal 432 reaches only V_Inx_samp–Vthn allowing V_inx_samp to be taken up to VDD+Vthn without reliability issues resulting in a target speed and/or target SNR that is higher than what is provided by the dynamic comparator 300 of FIG. 3A. The reduced current profile in devices M3 and M4 also reduces the input referred noise of the dynamic comparator circuit 400 compared to dynamic comparator circuit 300 and also increases the time window available for the subsequent latch stage to operate in the preamplifier output as additional benefits. Finally, since the parasitic capacitance at nodes OUTP, OUTM and Tail does not fall all the way to 0, the dynamic comparator circuit 400 consumes significantly lower power than the dynamic comparator circuit 300.

In some examples, a system (e.g., an integrated circuit, a chip, a multi-die module, or a PCB with discrete components and/or or integrated circuit components) includes ADC logic, wherein the ADC logic comprises a stage with a dynamic comparator circuit (e.g., the dynamic comparator circuit 106A). As described herein, the dynamic comparator circuit includes a preamplifier (e.g., the preamplifier circuit 107A) and a common mode clamp circuit (e.g., the common mode clamp circuit 108A) for the preamplifier. In some examples, the stage comprises a stage 1 flash circuit (e.g., the stage 1 flash circuit 104A). In some examples, the stage 1 flash comprise a latch circuit coupled to the preamplifier.

As described herein, in some examples, a dynamic comparator circuit is a differential comparator circuit. In such case, the preamplifier of the dynamic comparator circuit is a differential preamplifier. In some examples, the preamplifier comprises a pair of transistors (e.g., M1 and M2 in FIG. 4A), each transistor having a control terminal, a first current terminal, and a second current terminal, wherein each respective control terminal is coupled to a control signal node (e.g., the control signal node 412 of FIG. 4A), wherein each respective first current terminal is coupled to a supply voltage node (e.g., the supply voltage node 415 of FIG. 4A), and wherein each respective second current terminal is coupled to a respective differential output node (e.g., the differential output nodes 402 and 404 of FIG. 4A).

In some examples, the preamplifier of a dynamic comparator circuit also comprises a second pair of transistors (e.g., M3 and M4 of FIG. 4A) having a control terminal coupled to a respective differential input node (e.g., the differential input nodes 406 and 408), a first current terminal coupled to a respective differential output node (e.g., the differential output nodes 402 and 404), and a second current terminal coupled to a shared tail node (e.g., the shared tail node 416 in FIG. 4A). As described herein, in some examples, the disclosed dynamic comparator circuit (e.g., the dynamic comparator circuit 104A) also includes common mode clamp circuit (e.g., the common mode clamp circuit 108B in FIG. 4A) coupled to the shared tail node (e.g., the shared tail node 416 in FIG. 4A) via a first tail transistor (e.g., M6 in FIG. 4A) having its first current terminal coupled to the shared tail node (e.g., the shared tail node 416 in FIG. 4A), its control terminal coupled to a control signal node (e.g., the control signal node 410 in FIG. 4A), and its second current terminal coupled to the common mode clamp circuit (e.g., the common mode clamp circuit 108B in FIG. 4A).

In some examples, a common mode clamp circuit comprises a third pair of transistors (e.g., M7 and M8 of FIG. 4A), each transistor of the third pair of transistors having a control terminal, a first current terminal, and a second current terminal, wherein each respective control terminal is coupled to a respective differential output node (e.g., the differential output nodes 402 and 404 of FIG. 4A), wherein each respective first current terminal is coupled to the second current terminal of the tail transistor (e.g., M6 of FIG. 4A), and wherein each respective second terminal is coupled to a ground node.

In some examples, a preamplifier circuit further comprises a second tail transistor (e.g., M5 of FIG. 4A) having its first current terminal coupled to a power supply node (e.g., the power supply node 417 of FIG. 4A), its control terminal coupled to a control signal node (e.g., the control signal node 414 of FIG. 4A), and its second current terminal coupled to the shared tail node (e.g., the shared tail node 416 of FIG. 4A). In some examples, the first pair of transistors (e.g., M1 and M2 in FIG. 4A) comprise PMOS transistors. In some examples, the preamplifier circuit of a dynamic comparator is self-biased. In a self-biased circuit, the circuit limits the current consumption as well as shuts off after operation without relying on other external control signals or bias signals.

Figure 5:
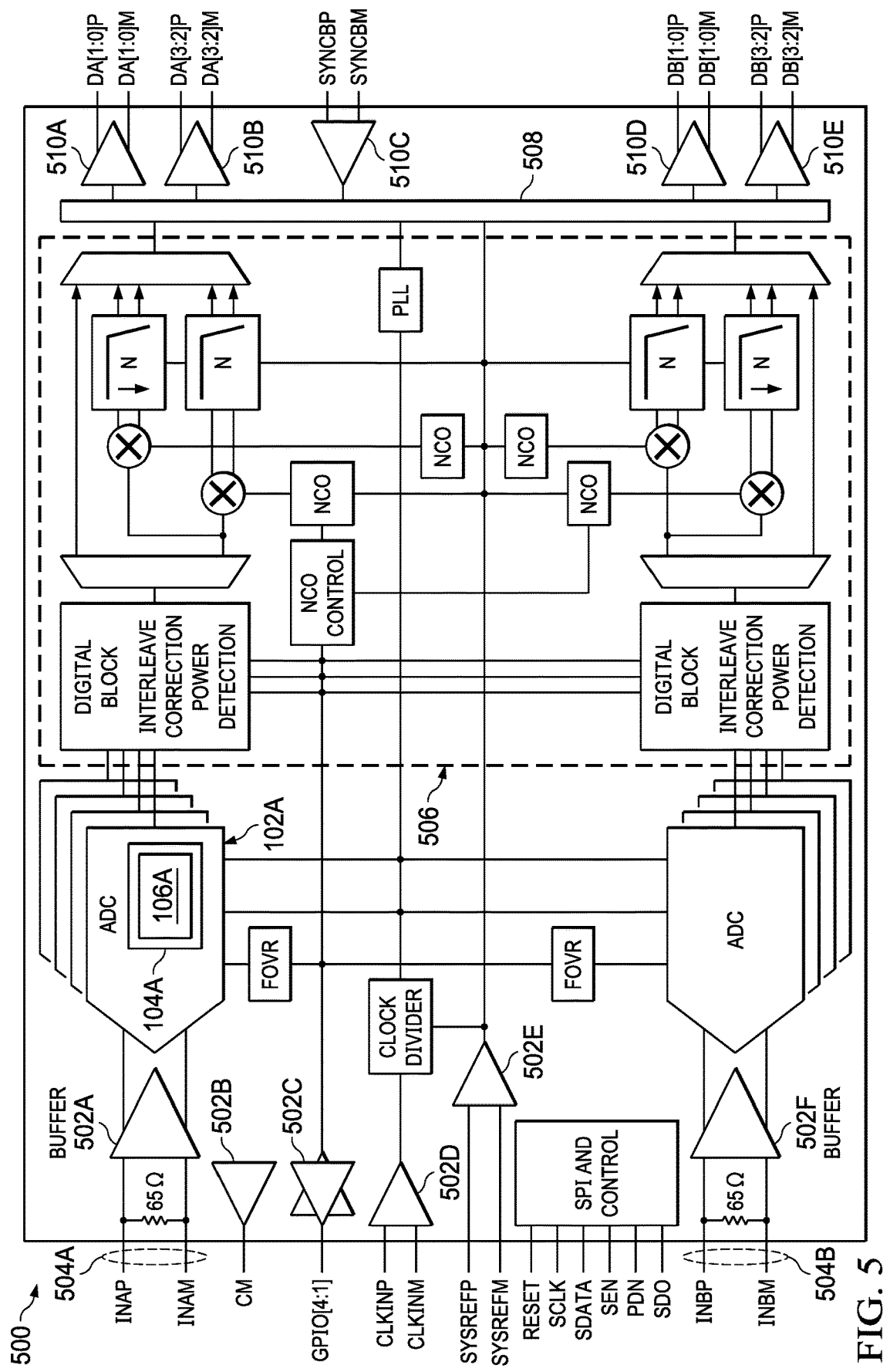
FIG. 5 is a block diagram of an ADC device in accordance with various examples.

FIG. 5 is a block diagram of an ADC device 500 in accordance with various examples. In the example of FIG. 5, the ADC device represents a dual-channel ADC device, where at least one of the channels includes ADC logic 102A having the stage 1 flash circuit 104A with the dynamic comparator 106A described herein. In some examples, the ADC device 500 supports radio frequency (RF) sampling with input frequencies up to 4 Ghz or more. In some examples, the ADC device 500 has a low noise spectral density (on the order of −155 dBFS/Hz) as well as dynamic range and channel isolation over a large input frequency range. As shown, the ADC 500 includes various buffers 502A-502F to buffer the analog input, where on-chip termination provides uniform input impedance across a wide frequency range and minimizes sample-and-hold glitch energy. Each of the ADC channels 504A and 504B can be connected to a dual-band, digital down-converter (DDC) 506 with up to three independent, 16-bit numerically-controlled oscillators (NCOs) per DDC for phase-coherent frequency hopping. Additionally, the ADC device 500 is equipped with frontend peak and RMS power detectors and alarm functions to support external automatic gain control (AGC) algorithms. At the output of the ADC device 500, a serial interface 508 (e.g., to support a subclass 1-based deterministic latency using data rates up to 12.5 Gbps with up to four lanes per ADC) and output buffers 510A-510E are used.

The ADC device 500 is merely an example and is not intended to limit uses of a dynamic comparator (e.g., the dynamic comparator 106A) with a preamplifier and common mode clamp circuit to a particular ADC device. In different examples, ADC devices vary with regard to the number of ADC channels, the number of output bits, the number of ADC stages, and/or other ADC options. By using a dynamic comparator (e.g., the dynamic comparator 106A) with a preamplifier and a common mode clamp as described herein, the voltage at internal nodes of the preamplifier of the dynamic comparator 106A are limited without any additional bias or clock signal. In this manner, the preamplifier is able to handle a higher common mode and/or differential input, resulting in higher speed and SNR with minimal overhead in terms of additional components or control signals.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. A system, comprising:
analog-to-digital converter (ADC) logic having outputs, wherein the ADC logic comprises:
a stage with a dynamic comparator circuit wherein the dynamic comparator circuit comprises:
a preamplifier; and a common mode clamp circuit for the preamplifier;
a residue stage having inputs wherein the inputes of the residue stage are coupled to the outputs of the ADC logic,
wherein the dynamic comparator circuit is a differential comparator circuit, and the preamplifier is a differential preamplifier.

2. A system, comprising:
analog-to-dial converter (ADC) logic, wherein the ADC logic comprises:
a stage with a dynamic comparator circuit; and
a residue stage, wherein the dynamic comparator circuit comprises:
a preamplifier; and
a common mode clamp circuit for the preamplifier;
further comprising a top-plate sampling arrangement configured to provide input samples to the ADC logic;
wherein the preamplifier comprises a pair of transistors, each transistor having a control terminal, a first current terminal, and a second current terminal, wherein each respective control terminal is coupled to a control signal node, wherein each respective first current terminal is coupled to a supply voltage node, and wherein each respective second current terminal is coupled to a respective differential output node.

3. The system of claim 2, wherein the pair of transistors comprises a first pair of transistors, and wherein the preamplifier comprises a second pair of transistors, each transistor of the second pair of transistors having a control terminal coupled to a respective differential input node, a first current terminal coupled to a respective differential output node, and a second current terminal coupled to a shared tail node.

4. The system of claim 3, wherein the common mode clamp circuit is coupled to the shared tail node via a first tail transistor having its first current terminal coupled to the shared tail node, its control terminal coupled to a control signal node, and its second current terminal coupled to the clamp circuit.

5. The system of claim 4, wherein the common mode clamp circuit comprises a third pair of transistors, each transistor of the third pair of transistors having a control terminal, a first current terminal, and a second current terminal, wherein each respective control terminal is coupled to a respective differential output node, wherein each respective first current terminal is coupled to the second current terminal of the tail transistor, and wherein each respective second terminal is coupled to a ground node.

6. The system of claim 3, wherein preamplifier further comprises a second tail transistor having its first current terminal coupled to a power supply node, its control terminal coupled to a control signal node, and its second current terminal coupled to the shared tail node.

7. The system of claim 5, wherein the second pair of transistors and the third pair of transistors comprise NMOS transistors.

8. The system of claim 7, wherein the first pair of transistors comprise PMOS transistors.

9. A system, comprising:
analog-to-digital converter (ADC) logic having inputs and outputs, wherein the ADC logic comprises:
a stage with a dynamic comparator circuit wherein the dynamic comparator circuit comprises:
a preamplifier; and
a common mode clamp circuit for the preamplifier;
a residue stage having inputs wherein the inputs of the residue stage are coupled to the outputs of the ADC logic,
wherein preamplifier is self-biased.

10. A device, comprising:
a preamplifier circuit comprising:
a first pair of transistors, each transistor of the first pair of transistors having a control terminal, a first current terminal, and a second current terminal, wherein each respective control terminal is coupled to a control signal node, wherein each respective first current terminal is coupled to a supply voltage node, and wherein each respective second current terminal is coupled to a respective differential output node;
a second pair of transistors, each transistor of the second pair of transistors having a control terminal coupled to a respective differential input node, a first current terminal coupled to a respective differential output node, and a second current terminal coupled to a shared tail node; and
a common mode clamp circuit.

11. The device of claim 10, wherein the common mode clamp circuit is coupled to the shared tail node via a first tail transistor having its first current terminal coupled to the shared tail node, its control terminal coupled to a control signal node, and its second current terminal coupled to the clamp circuit.

12. The device of claim 11, wherein the common mode clamp circuit comprises a third pair of transistors, each transistor of the third pair of transistors having a control terminal, a first current terminal, and a second current terminal, wherein each respective control terminal is coupled to a respective differential output node of the preamplifier circuit, wherein each respective first current terminal is coupled to the second current terminal of the tail transistor, and wherein each respective second current terminal is coupled to a ground node.

13. The device of claim 12, wherein preamplifier circuit further comprises a second tail transistor having its first current terminal coupled to a power supply node, its control terminal coupled to a control signal node, and its second current terminal coupled to the shared tail node.

14. The device of claim 10, wherein the preamplifier circuit is part of analog-to-digital converter (ADC) logic in the form of an integrated circuit.

15. The device of claim 12, wherein the second pair of transistors and the third pair of transistors comprise NMOS transistors sized to maintain a predetermined relationship between a voltage level at the tail node and a threshold voltage for the clamp circuit.

16. The device of claim 15, wherein the first pair of transistors comprise PMOS transistors.

* * * * *